United States Patent
Hsiao et al.

(10) Patent No.: US 9,064,497 B2
(45) Date of Patent: Jun. 23, 2015

(54) METHOD AND APPARATUS FOR AUDIO INTELLIGIBILITY ENHANCEMENT AND COMPUTING APPARATUS

(71) Applicant: HTC Corporation, Taoyuan County (TW)

(72) Inventors: Jen-Po Hsiao, Taoyuan (TW); Ting-Wei Sun, Taoyuan (TW); Hann-Shi Tong, Taoyuan (TW)

(73) Assignee: HTC Corporation, Taoyuan (TW)

( * ) Notice: Subject to any disclaimer, the term of this patent is extended or adjusted under 35 U.S.C. 154(b) by 207 days.

(21) Appl. No.: 13/671,499

(22) Filed: Nov. 7, 2012

(65) Prior Publication Data

US 2013/0218560 A1   Aug. 22, 2013

Related U.S. Application Data (60) Provisional application No. 61/601,583, filed on Feb. 22, 2012.

(51) Int. Cl.
| | | |
|---|---|---|
| *G10L 21/00* | (2013.01) | |
| *G10L 19/00* | (2013.01) | |
| *G10L 21/02* | (2013.01) | |
| *H03G 3/32* | (2006.01) | |
| *G10L 21/034* | (2013.01) | |
| *G10L 21/0364* | (2013.01) | |
| *G10L 25/84* | (2013.01) | |

(52) U.S. Cl.
CPC ......... *G10L 21/0205* (2013.01); *G10L 21/0364* (2013.01); *H03G 3/32* (2013.01); *G10L 25/84* (2013.01); *G10L 21/034* (2013.01)

(58) Field of Classification Search
USPC ................... 704/200–230, 500–504
See application file for complete search history.

(56) References Cited

U.S. PATENT DOCUMENTS

| | | | | |
|---|---|---|---|---|
| 5,907,823 | A * | 5/1999 | Sjoberg et al. ............. | 704/225 |
| 2005/0027520 | A1* | 2/2005 | Mattila et al. ............. | 704/228 |
| 2005/0207583 | A1 | 9/2005 | Christoph | |
| 2006/0270467 | A1* | 11/2006 | Song et al. ................ | 455/570 |
| 2008/0319740 | A1* | 12/2008 | Su et al. .................... | 704/225 |
| 2009/0010452 | A1 | 1/2009 | Unno et al. | |

(Continued)

FOREIGN PATENT DOCUMENTS

| | | |
|---|---|---|
| CN | 1830141 A | 9/2006 |
| GB | 2306086 A | 4/1997 |

(Continued)

OTHER PUBLICATIONS

"Office Action of Japan Counterpart Application", issued on Jul. 15, 2014, p. 1.

(Continued)

*Primary Examiner* — Jesse Pullias
(74) *Attorney, Agent, or Firm* — Jianq Chyun IP Office (57) ABSTRACT

Method and apparatus for audio intelligibility enhancement and computing apparatus are provided. The method includes the following steps. Environment noise is detected by performing voice activity detection according to a detected audio signal from at least a microphone of a computing device. Noise information is obtained according to the detected environment noise and a first audio signal. A second audio signal is outputted by boosting the first audio signal under an adjustable headroom by the computing device according to the noise information and the first audio signal.

23 Claims, 5 Drawing Sheets

(56) References Cited

U.S. PATENT DOCUMENTS

| | | |
|---|---|---|
| 2009/0015651 A1* | 1/2009 | Togami et al. ............ 348/14.01 |
| 2010/0017205 A1 | 1/2010 | Visser et al. |
| 2010/0246849 A1 | 9/2010 | Sudo et al. |
| 2011/0081026 A1* | 4/2011 | Ramakrishnan et al. .... 381/94.3 |

FOREIGN PATENT DOCUMENTS

| | | |
|---|---|---|
| JP | 10-135755 | 5/1998 |
| JP | 2000163098 | 6/2000 |
| JP | 2002369281 | 12/2002 |
| JP | 2004-173173 | 6/2004 |
| JP | 2007500466 | 1/2007 |
| JP | 2007110527 | 4/2007 |
| JP | 2009163105 | 7/2009 |
| KR | 20060054367 | 5/2006 |
| TW | 200926151 | 6/2009 |
| WO | 2010044622 A2 | 4/2010 |
| WO | 2013166439 | 11/2013 |
| WO | 2014021890 | 2/2014 |

OTHER PUBLICATIONS

"Office Action of Korea Counterpart Application", issued on Jan. 23, 2014, p. 1-p. 7.

"Office Action of Japan Counterpart Application", issued on Jan. 17, 2014, p. 1-p. 3.

"Office Action of Taiwan Counterpart Application", issued on Sep. 3, 2014, p. 1-p. 8.

"Office Action of European Counterpart Application", issued on Oct. 30, 2014, p. 1-p. 11.

"Office Action of European Counterpart Application", issued on Oct. 31, 2014, p. 1-p. 4.

"Office Action of China Counterpart Application", issued on Feb. 13, 2015, p1-p11, in which the listed references were cited.

* cited by examiner

METHOD AND APPARATUS FOR AUDIO INTELLIGIBILITY ENHANCEMENT AND COMPUTING APPARATUS

This application claims the benefit of U.S. provisional application Ser. No. 61/601,583, filed Feb. 22, 2012, the subject matter of which is incorporated herein by reference.

BACKGROUND

1. Technical Field

The disclosed embodiments relate in general to audio intelligibility enhancement, and more particularly to method and apparatus for audio intelligibility enhancement for signals and a computing apparatus.

2. Description of the Related Art

The quality of the audio during a phone call is important experience for a mobile phone user. Some mobile phones employ noise reduction to improve the quality of outbound audio signal during a call by reducing the environmental noise embedded in the outbound audio signal. Meanwhile, the quality of the incoming audio signal may deteriorate due to the environmental noise. In this case, the mobile phone user has to make the volume of the mobile phone greater manually. This approach is inconvenient for the user and may not obtain appropriate quality for listening if the volume is overly loud.

SUMMARY

The disclosure is directed to a method and apparatus for audio intelligibility enhancement for signals for reproduction and a computing apparatus.

According to one embodiment, a method for audio intelligibility enhancement is provided. The method includes the following steps. Environment noise is detected by performing a voice activity detection according to a detected audio signal from at least a microphone of a computing device. Noise information is obtained according to the detected environment noise and a first audio signal. A second audio signal is outputted by boosting the first audio signal under an adjustable headroom by the computing device according to the noise information and the first audio signal.

According to another embodiment, an apparatus for audio intelligibility enhancement is provided. The apparatus includes an environment noise determination unit and an intelligibility enhancement unit. The environment noise determination unit is used for detecting environment noise according to a detected audio signal from at least a microphone of the computing device. The intelligibility enhancement unit, coupled to the environment noise determination unit, is used for obtaining noise information according to the detected environment noise and a first audio signal and for outputting a second audio signal by boosting the first audio signal under an adjustable headroom according to the noise information and the first audio signal.

According to an alternative embodiment, a computing apparatus is provided. The computing apparatus comprises at least a microphone, a processing unit for controlling the computing apparatus, a communication unit and a signal processing unit for audio intelligibility enhancement. The signal processing unit, coupled to the processing unit and the communication unit, for audio intelligibility enhancement, includes an environment noise determination unit and an intelligibility enhancement unit. The environment noise determination unit is used for detecting environment noise according to a detected audio signal from the at least a microphone. The intelligibility enhancement unit, coupled to the environment noise determination unit, is used for obtaining noise information according to the detected environment noise and a first audio signal and for outputting a second audio signal by boosting the first audio signal under an adjustable headroom according to the noise information and the first audio signal.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
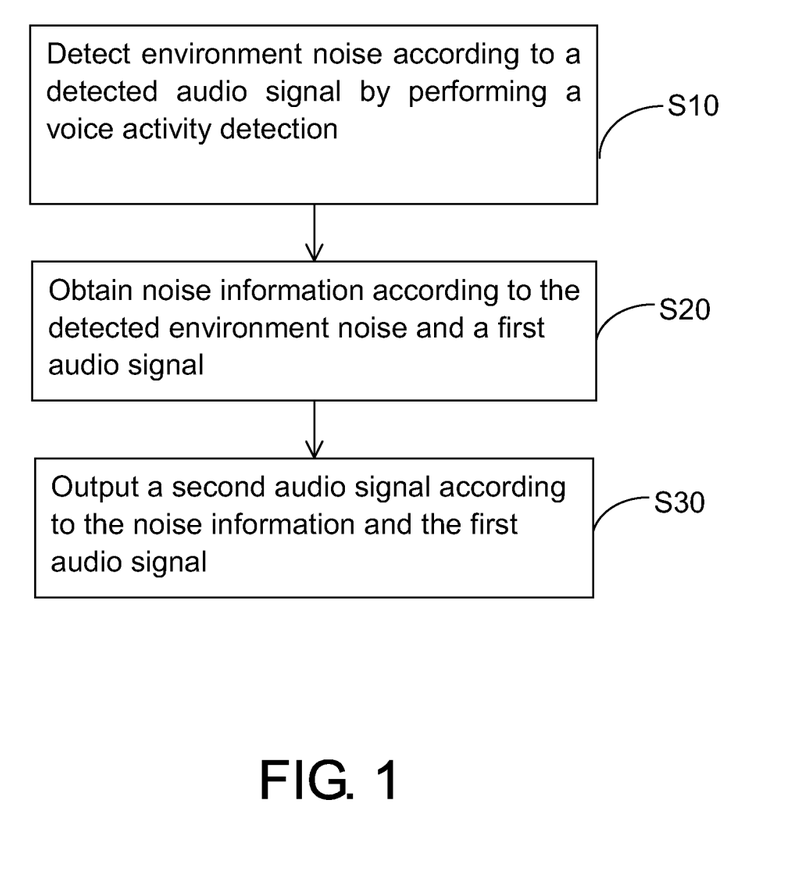
FIG. 1 illustrates a flow chart of a method for audio intelligibility enhancement according to an embodiment.

Embodiments of a method and apparatus for audio intelligibility enhancement for reproduced signals in a computing device, and a computing apparatus are provided. FIG. 1 illustrates a flowchart of a method for audio intelligibility enhancement in a computing device according to an embodiment. According to an embodiment of this method, the audio intelligibility of the downlink voice can be enhanced during a call, even if the call is being made or received in a noisy environment. In other embodiments, the method can also employed to enhance intelligibility of audible sound during reproduction, such as from a multimedia source by playing an audio file, a multimedia file, streamed audio or video (e.g., watching video from YouTube on a computing device), even if the environment noise is too loud. Further, protection for the hardware of the mobile apparatus and the hearing of the user can additionally be considered in the implementation of the audio intelligibility enhancement.

The method can be employed in a computing apparatus, such as a computing device with voice communication functionality (telephony, mobile communication, VoIP or the like), e.g., a mobile phone, smartphone, a tablet computer, a notebook computer, and so on. A structure from which a mobile apparatus can be derived is illustrated in an exemplary embodiment shown in FIG. 2, wherein the mobile apparatus 2 includes a signal processing unit 21, a communication unit 23, a processing unit 25 (e.g., with a single core or multi-core), at least one microphone M1, and at least one speaker SK1. For example, the method can be employed in the signal processing unit 21 which receives a downlink voice signal (SRx) from the communication unit 23 (supporting one or more communication standards, such as 2G, 3G, 3.5G, LTE, 4G) and outputs an uplink voice signal (STx) to the communication unit 23.

Figure 2:
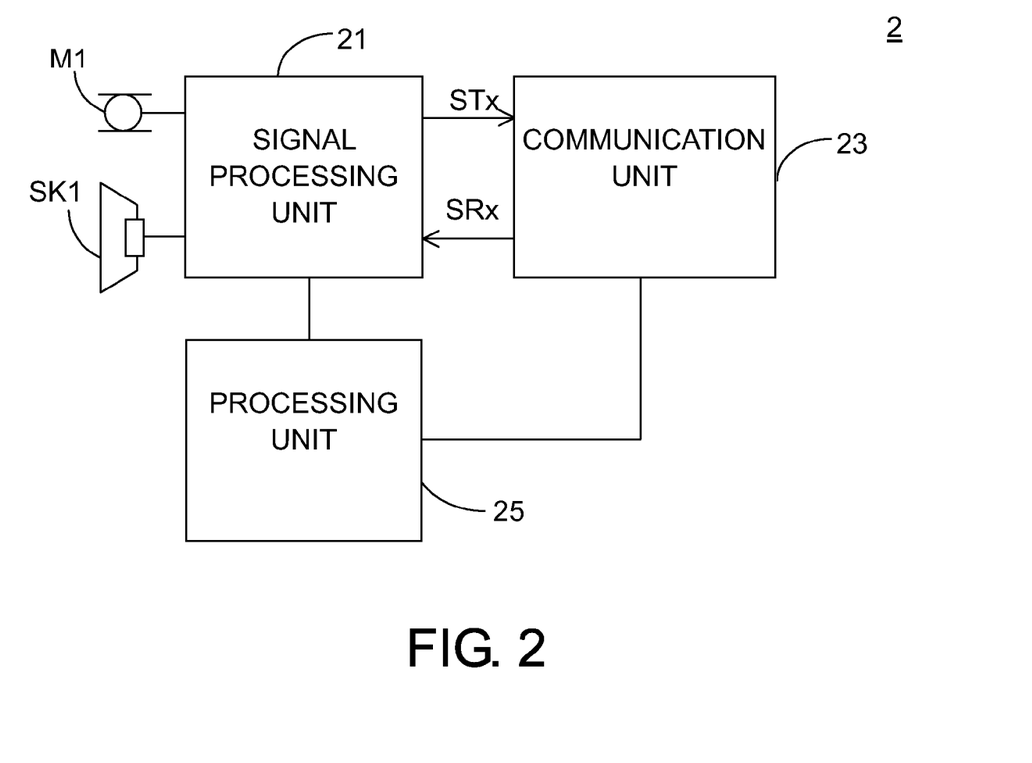
FIG. 2 shows a block diagram of a computing apparatus according to an embodiment.

In other examples, the method can be employed in a computing apparatus with multimedia functionality, such as a personal computer, a laptop, a multimedia device, a game machine, or so on, so as to enhance its audio intelligibility. For example, the method can be employed in the signal processing unit 21 which receives an audio signal (SRx) from the processing unit 25 or the communication unit 23 (or even a multimedia chip or source) during reproduction of a multimedia source, i.e., audio or multimedia data, for example, music or video files stored on the computing apparatus, or streamed audio or video (e.g., watching YouTube on mobile apparatus) from a remote device, a website, or a device in a network cloud. Further, the method also can be utilized in a mobile apparatus with a wireless network functionality (e.g., Wi-Fi) so as to enhance audio intelligibility for IP-based voice communication or streamed multimedia.

Referring to FIG. 1, in step S10, environment noise is detected according to a detected audio signal, e.g., by performing voice activity detection (VAD). For example, the detected audio signal is a signal from at least a microphone, such as the microphone Ml, for uplink during a call (e.g., telephony, mobile communication, or Voice-over-IP) or without uplink during audio or multimedia data reproduction. In step S20, noise information is obtained according to the detected environment noise and a first audio signal, which is to be enhanced its audio intelligibility, such as a downlink voice signal (e.g., SRx) or an audio signal from the processing unit 21 or a multimedia chip or source. In step S30, a second audio signal is outputted, e.g., boosted (or amplified), according to the noise information and the first audio signal. The second audio signal can then be regarded as an audio-intelligibility-enhanced version of the first audio signal. In some examples, the second audio signal (which can be in digital or analog form) is to be reproduced by the computing apparatus with its speaker or with a headset, or outputted for other purposes, such as recording by the computing apparatus, reproduction by external speakers, or broadcasting wirelessly through the computing apparatus.

In an exemplary embodiment, the second audio signal is outputted by boosting the first audio signal under an adjustable headroom by the computing device. In other embodiments, the noise information indicates a measurement level of the detected environment noise with respect to the first audio signal. For example, noise information, such as signal-to-noise ratio or noise signal strength or other measurements of noise, can be determined for use in step S30, for example, to boost the first audio signal.

In this manner as exemplified by the method in FIG. 1, the application of the detected environment noise from the detected audio signal (e.g., the signal from the microphone) using VAD facilitates the audio intelligibility enhancement for the first audio signal (e.g., the downlink voice signal SRx or the audio signal for reproduction). It is noted that by using VAD, the detected environment noise is accurate enough for step S20 to provide reliable noise information for the following determination and amplification in an example of step S30. This approach also avoids incorrect determination of the voice or sound as environment noise and inappropriate or abnormal boosting or amplification of the downlink voice signal in the example of step S30.

In an example, step S30 can be implemented as enabling the boosted downlink voice signal to maintain a signal-to-noise (SNR) ratio of not greater than a target level (e.g., 3 dB). If the detected environment noise has a level (denoted by Le) of −15 dB and the downlink voice signal is at a level (denoted by Ld) of −30 dB, the boosted downlink voice signal can be at a signal level of Ld plus a value Lg to achieve the target level.

With respect to a noisy environment, the user of the computing device may suffer from poor audio intelligibility of the downlink audio signal during a call in a noisy environment, even though the volume of the speaker has been increased. To the worst case, the driving of the overly boosted downlink voice signal may lead to hardware damage to the audio components or the speaker. The overly boosted downlink voice signal may bring unpleasant listening experience or even harmful to the hearing of the user. In this regard, in some examples, the value Lg can be designed to be within a headroom (i.e., the maximum allowable increase in gain) for the sake of signal quality or hardware protection of the mobile apparatus. The headroom may also be defined as the difference between the nominal signal value and the maximum undistorted value. For example, following the above numerical example, the headroom can be predetermined to be 10 dB so that the boosted downlink voice signal can be boosted to have a signal level of −5 dB (i.e., −15 dB+10 dB).

Figure 4:
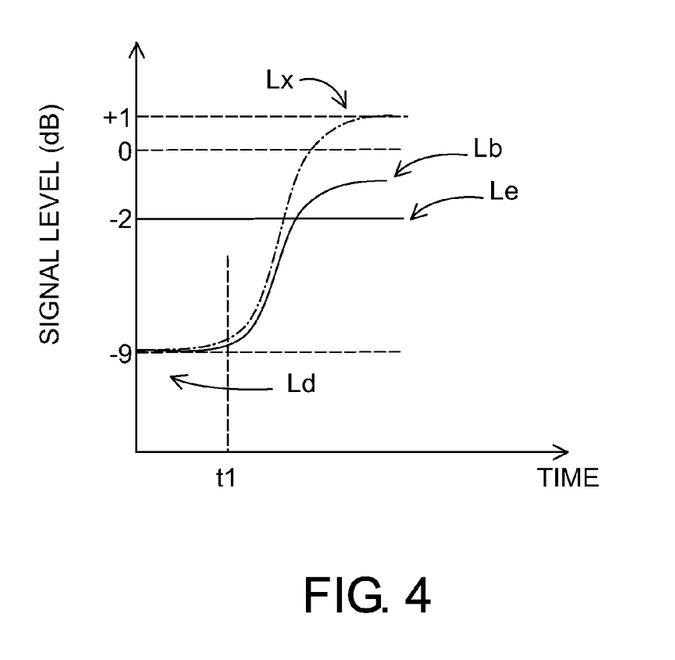
FIG. 4 illustrates embodiments of operating in an audio intelligibility enhancement unit.

However, in a situation where the signal level of the downlink voice signal is large or close to the maximum level (e.g., 0 dB), the boosted downlink voice signal could be distorted. In a case as indicated in FIG. 4, if the level Le of the detected environment noise is −2 dB and the downlink voice signal is at a level Ld of −9 dB before time t1, the boosted downlink voice signal can be expected to have a signal level Lx of +1 dB (i.e., −9 dB+10 dB), with a predetermined headroom of 10 dB. It is noted that it is impossible for the signal level to be over the maximum signal level of 0 dB in digital domain, the boosted downlink voice signal in this case would be distorted at the maximum signal level. This would lead to hardware damage to the speaker or hardware of the mobile apparatus or may bring unpleasant listening experience or even harmful to the hearing of the user.

Accordingly, in other embodiments, step S30 can be implemented with an adjustable headroom. For example, the adjustment of the headroom may depend on one or more conditions or can be made dynamically. In addition, the headroom can be set so as to avoid other damage to hardware or human hearing as well as the signal distortion.

In some examples, the adjustable headroom is adjusted according to a signal level of the first audio signal such that a signal level of the second audio signal is linearly or non-linearly proportional to the signal level of the first audio signal but still below a clipping level e.g., 0 dB.

In one example, the boosting of the downlink voice signal in step S30 can be determined using a headroom with a first value (e.g., 10 dB) when the downlink voice signal level (e.g., signal energy level) is under a specific threshold level (i.e., not close to the maximum level) and using the headroom with a second value (e.g. 5 dB) less than the first value when the downlink voice signal level (e.g., −9 dB) is over the specific threshold level. Referring to FIG. 4, when the headroom is 8 dB which is less than the first value, the boosted downlink voice signal is at a level (denoted by Lb) of −1 dB which is lower than the maximum level, thus leading to the boosted downlink voice signal at safety for the hardware protection and human hearing, even in a noisy environment as exemplified above.

In another example, the headroom can be adjustable, according to the volume control level of the mobile apparatus 2. For example, the signal processing unit 21 is informed of the volume data indicating the volume control level, when the volume control level is changed. The signal processing unit 21 performs step S30 with the headroom of different values according to the volume data. For example, if the volume data indicating that the volume control level is at or under a specific threshold level (e.g., a middle level or above), the headroom can be set to a first value (e.g., 10 dB). If the volume data indicating that the volume control level is at or close to the maximum level or over the specific threshold, the headroom can be set to a second value (e.g., 5 dB) which is less than the first value. In other examples, the headroom can be adjusted according to one or more conditions, e.g., according to the downlink voice signal level and the volume control level.

Figure 5:
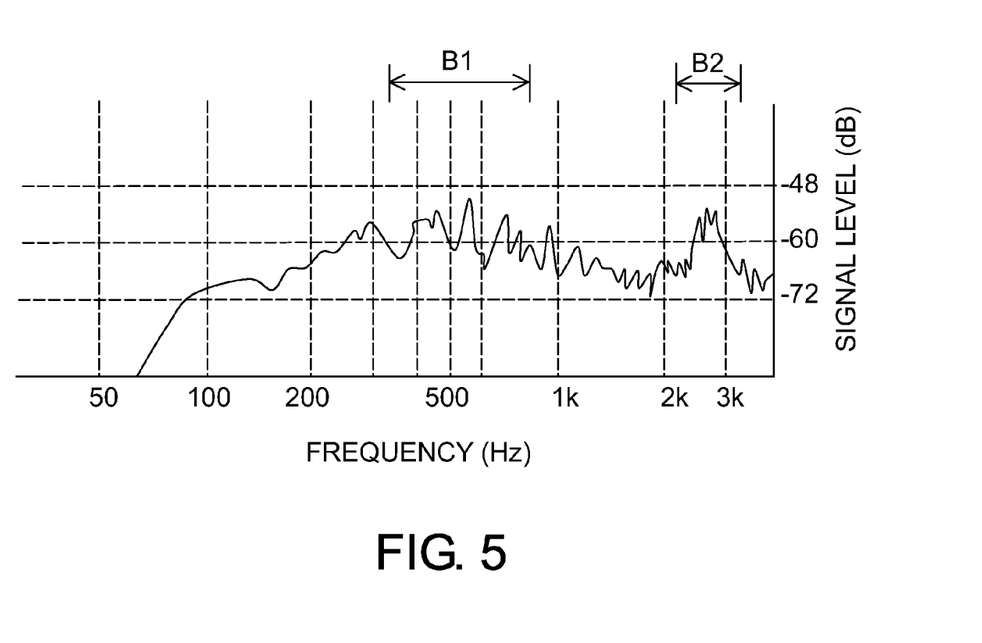
FIG. 5 illustrates an embodiment of boosting the downlink voice by different frequency bands.

Further in other examples, the first audio signal in step S30 can also be boosted with respect to different frequency bands. For example, a noise spectrum is shown in FIG. 5. In order to keep enough SNR, the audio signal (e.g., the downlink voice or an audio signal from a source such a file or streamed video or audio) at one or more frequency bands is boosted, considering audio intelligibility for human hearing. In this example, frequency bands around 500 Hz (denoted by B1) and 3 kHz (denoted by B2) of the downlink voice signal should be boosted.

Figure 3A:
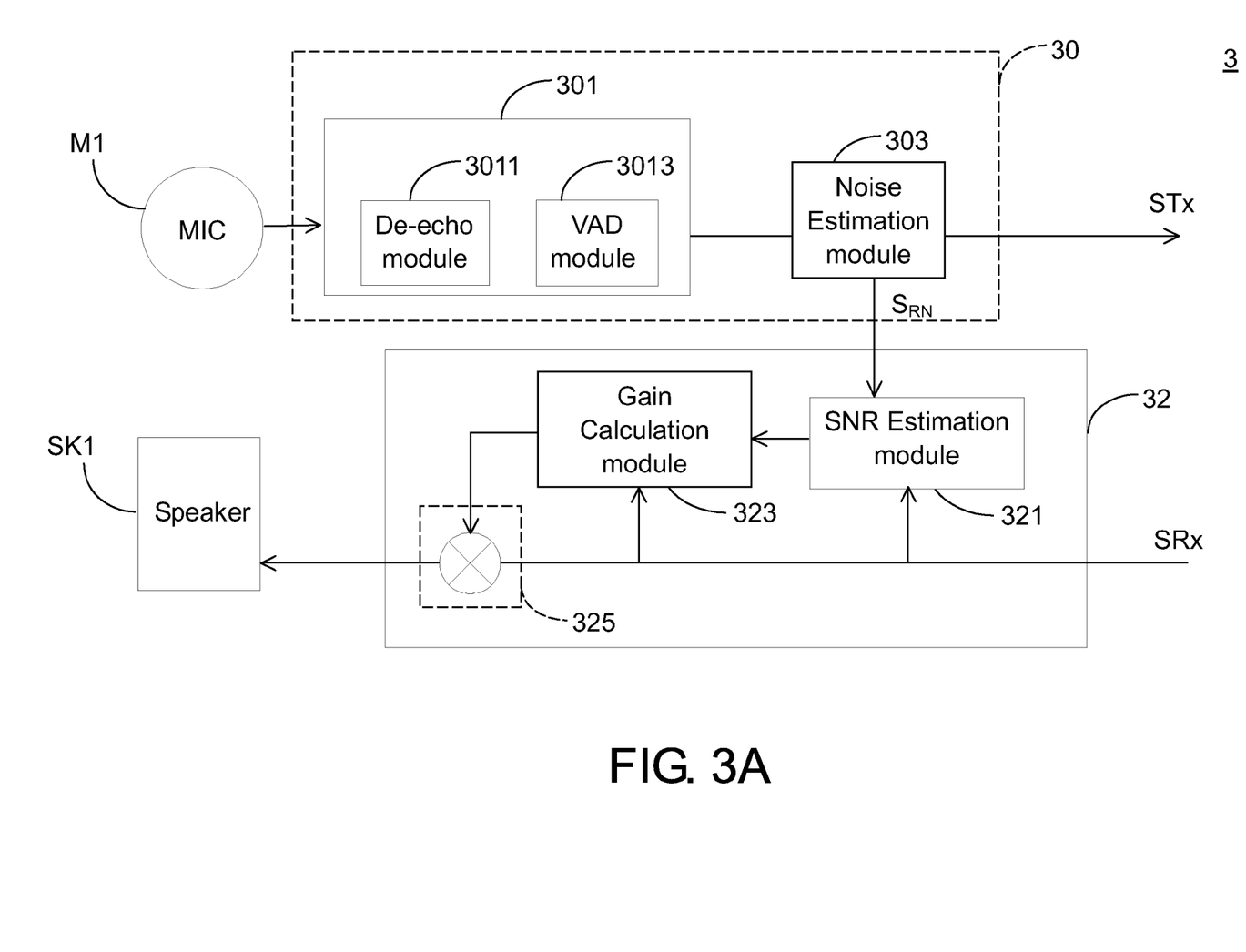
FIG. 3A illustrates a block diagram of a system for audio intelligibility enhancement in a computing device according to an embodiment.

Referring to FIG. 3A, a block diagram illustrates a system for audio intelligibility enhancement in a computing device according to an embodiment. The system 3, in response to a detected audio signal from at least one microphone M1 of a computing apparatus and a first audio signal to be enhanced its audio intelligibility (e.g., a downlink voice signal from a communication unit 23 in FIG. 2 of the mobile apparatus or a signal from the processing unit 25 for audio reproduction), outputs a second audio signal to at least one speaker SK1 of the computing apparatus. The system 3 includes an environment noise determination unit 30 and an intelligibility enhancement unit 32. The system 3 can be implemented as software, circuitry, or can be implemented by programming a signal processing unit or a general processor. The environment noise determination unit 30 can be regarded as an embodiment of step S10 as indicated in FIG. 1. The intelligibility enhancement unit 32 can be regarded as an embodiment of steps S20 and S30 as indicated in FIG. 1.

The environment noise determination unit 30 includes a pre-processing module 301 and a noise estimation module 303. The pre-processing module 301 performs voice activity detection (VAD) indicated by a VAD module 3013 to determine whether the detected audio signal from the microphone M1 indicates audio or noise. The pre-processing module 301 outputs the determination result to the noise estimation module 303. In response to the determination result and the audio signal from the pre-processing module 301, the noise estimation module 303 outputs a reference noise signal $S_{RN}$ representing the environment noise at the place at which the mobile apparatus is located. That is, the noise estimation module 303 can output the detected environment noise when the detected audio signal indicates noise. Regarding this, various equivalent embodiments can be realized. In one of the embodiments, the noise estimation module 303 outputs the detected audio signal from the pre-processing module 301 and the reference noise signal $S_{RN}$ indicates the environment noise with information for SNR estimation. For example, if the VAD module 3013 indicates that the detected audio signal is representing user's voice, the noise estimation module 303 outputs the reference noise signal $S_{RN}$ along with a lower noise score. If the detected audio signal is representing a noise, for example, similar to a specific sound like a child's screaming, the noise estimation module 303 outputs the reference noise signal $S_{RN}$ with a higher noise score, which informs the following stages (such as SNR estimation) that the environment noise of the reference noise signal $S_{RN}$ may be ignored. In another of the embodiments, the noise estimation module 303 can be implemented as outputting environment noise only when the VAD module 3013 indicates no voice activity or noise score is lower than a specific threshold. As such, implementation of the noise estimation 303 can be realized in other manners, not limited to the examples above.

The VAD module 3013 is to avoid incorrect determination of the voice or sound as environment noise and facilitate appropriate noise estimation and boosting or amplification of the first audio signal in the following stages. In some examples, energy level threshold can be taken as a condition for voice activity detection. If the signal level is over a specific energy level threshold, it is determined that the audio signal for uplink indicates a voice activity. Conversely, if the signal level is lower than the specific threshold, the audio signal is regarded as the environment noise. In other examples, audio feature can be extracted from the detected audio signal in frequency or time domain in the VAD module 3013 for determining voice activity. In the examples, predetermined audio features, such as sound of speaking, walking, in the office or train station and so on can be stored and used for reference in the determination of voice activity. In one example, the VAD module 3013 can be implemented as outputting the detected audio signal with a determination result for voice activity (e.g., a noise score; or an indication of voice or noise) in series or parallel.

In addition, the pre-processing module 301 can also perform de-echo processing as indicated by a de-echo module 3011 before the VAD module 3013 so that the determination result of voice activity can be more accurate. For example, the de-echo processing of the de-echo module 3011 can be implemented by a time-domain adaptive filter and the de-echo module 3011 outputs a de-echoed version of the detected audio signal to the VAD module 3013.

In other examples, the environment noise determination unit 30 can detect environment noise according to the detected audio signal by using noise spectrum detection or estimation that can be employed to distinguish between human speech and noise.

Figure 6:
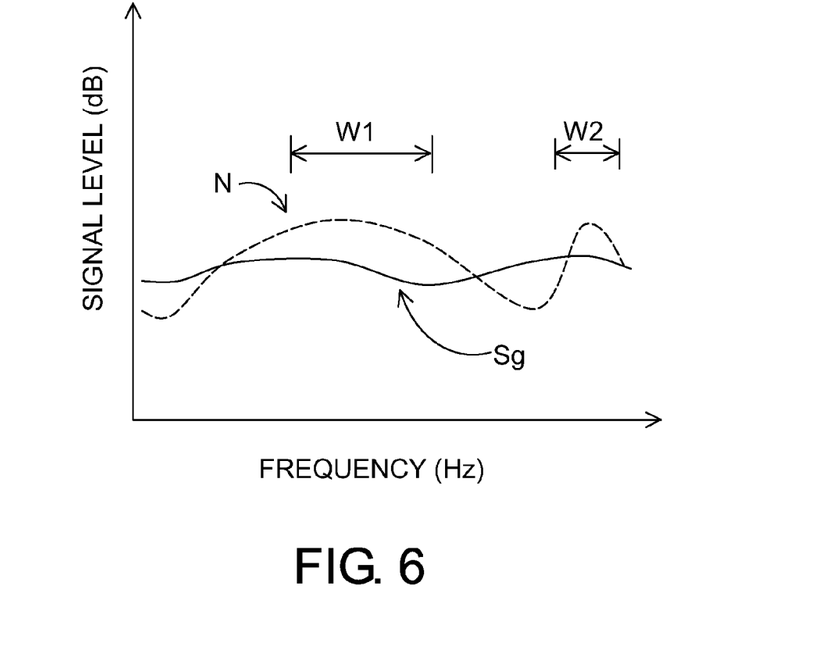
FIG. 6 illustrates an embodiment of noise information by way of SNR estimation.

The intelligibility enhancement unit 32 includes a signal-to-noise ratio (SNR) estimation module 321, a gain calculation module 323, and a boosting module 325. The SNR estimation module 321 is to obtain noise information, as indicated in step S20. In response to the reference noise signal $S_{RN}$ and the downlink voice signal SRx, the SNR estimation module 321 outputs the noise information, such as noise level over frequency as indicated in FIG. 6 by a dashed curve N. The gain calculation module 323 and the boosting module 325 are used for boosting the downlink voice signal SRx, as indicated in step S30. In response to the noise information and the first downlink voice signal SRx, the gain calculation module 323 determines one or more parameters in order for controlling the boosting module 325 to boost the first downlink voice signal SRx. For example, the gain calculation module 323 determines that for some frequency bands, as shown in FIG. 6, the signal level for the first downlink voice signal SRx, as indicated by Sg, is lower than that for the environment noise N. Accordingly, the gain calculation module 323 determines that boosting the first downlink voice signal in the frequency band W1, for example, is needed and controls the boosting module 325 to boost the first downlink voice signal SRx for the determined frequency band to maintain sufficient SNR for audio intelligibility. On one or more frequency bands, such as frequency band W1 and W2 in FIG. 6, can be the determined frequency bands. For example, the gain calculation module 323 compares the noise level of the environment noise with the signal level of the first downlink voice signal SRx to determine the determination result for controlling the boost module 325, wherein the determination result may also include an amount of increase in the signal level for boosting module 325.

Further, the above examples for step S30 can also be applied to the gain calculation module 323 for determining one or more levels for boosting the downlink voice signal for one or more frequency bands. For example, the adjustment of the headroom in the gain calculation module 323 may depend on one or more conditions or can be made dynamically. In addition, the headroom can be set so as to avoid other damage to hardware or human hearing as well as the signal distortion. In some examples, the gain calculation module 323 can obtain the volume data from a processing unit or other component of the mobile apparatus so as to determine whether or how to adjust the headroom.

The boosting module 325 can be implemented using equalization or other boosting or amplification technique.

In some embodiments, one or more of the modules, units and blocks of the system 3 indicated in FIG. 3 can be implemented as software code, software modules, or a dedicated circuit (such as a chip or a circuit module in a chip), or implemented by programming a signal processing unit or a programmable chip, or a general processor. For example, the system 3 can be realized by using a processor (e.g., with one or multiple cores) such as an application processor or a digital signal processor (DSP), or an application-specific integrated circuit (ASIC), or in a field-programmable gate array (FPGA), which is designed to perform the specific operation of the system 3 in FIG. 3A (or the method in FIG. 1).

Figure 3B:
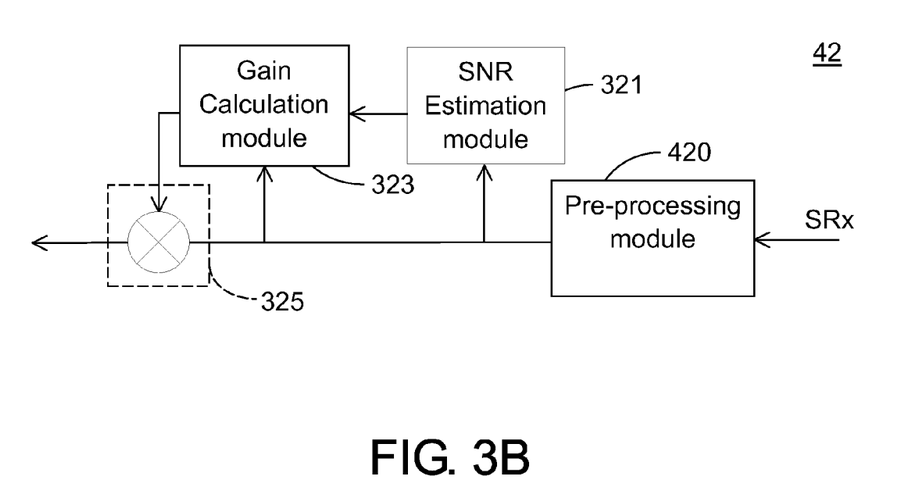
FIG. 3B illustrates a block diagram of another embodiment of the intelligibility enhancement unit.

Referring to FIG. 3B, another embodiment of an intelligibility enhancement unit is shown. As compared to FIG. 3A, an intelligibility enhancement unit 42 shown in FIG. 3B further includes a pre-processing module 420 on the path for a first audio signal for reproduction (e.g., denoted by SRx). In response to the first audio signal, the pre-processing module 420 outputs a pre-processed first audio signal to be amplified by the following stages if the first audio signal is representing a desirable voice or sound. For example, if the first audio signal, for some time during a call, indicates no voice or noise, it is undesirable and thus does not need to amplify or may be filtered out. In some embodiments, the pre-processing module 420 may include a VAD module or a noise estimation module, or both of them, as exemplified above. In some embodiments, the pre-processing module 420 may output one or more control signals or indication data to one or more other modules of the intelligibility enhancement unit 42 to enable the pre-processed first audio signal to be amplified by the following stages if the first audio signal is representing a desirable voice or sound.

Furthermore, other embodiments further disclose a machine or apparatus readable information storage medium for storing program code or one or multiple program modules. The program code may be executed to implement the method for audio intelligibility enhancement in FIG. 1 or the system 3 in FIG. 3A or 3B. The readable information storage medium in each of the embodiments includes, without limitation to, an optical information storage medium, a magnetic information storage medium or a memory, such as a memory card, firmware, ROM or RAM, as embodied by dedicated one or embedded in a programmable chip, such as digital signal processor or general processor.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for audio intelligibility enhancement in a computing device, comprising:
   detecting environment noise by performing a voice activity detection according to a detected audio signal from at least a microphone of the computing device;
   obtaining noise information according to the detected environment noise and a first audio signal; and
   outputting a second audio signal by boosting the first audio signal under an adjustable headroom by the computing device according to the noise information and the first audio signal, wherein the adjustable headroom is at a first value when a signal level of the first audio signal is under a threshold level and the adjustable headroom is at a second value less than the first value when the signal level of the first audio signal is over the threshold level, wherein the adjustable headroom is a maximum allowable increase in a gain of the boosting of the first audio signal.

2. The method according to claim 1, wherein the noise information indicates a measurement level of the detected environment noise with respect to the first audio signal.

3. The method according to claim 1, wherein the step of detecting environment noise comprises:
   performing the voice activity detection to determine whether the detected audio signal indicates noise or not; and
   outputting the detected environment noise when the detected audio signal indicates noise.

4. The method according to claim 1, wherein the step of detecting environment noise comprises:
   outputting a de-echoed version of the detected audio signal; and
   outputting the detected environment noise when the detected audio signal indicates noise;
   wherein the voice activity detection is performed according to the de-echoed version of the detected audio signal to determine whether the detected audio signal indicates noise or not.

5. The method according to claim 1, wherein the adjustable headroom is adjusted according to the signal level of the first audio signal such that a signal level of the second audio signal is proportional to the signal level of the first audio signal and below a clipping level.

6. The method according to claim 1, further comprising:
   determining whether the first audio signal is noise by performing a pre-processing on the first audio signal;
   wherein in the step of outputting the second audio signal, the second audio signal is outputted without boosting the first audio signal if it is determined by the pre-processing that the first audio signal is noise.

7. The method according to claim 6, wherein the pre-processing is performed on the first audio signal by using voice activity detection.

8. The method according to claim 6, wherein the pre-processing is performed on the first audio signal by using noise estimation.

9. The method according to claim 1, wherein the second audio signal is outputting by boosting the first audio signal with respect to at least one frequency band for human hearing.

10. An apparatus for audio intelligibility enhancement in a computing device, comprising:
   an environment noise determination unit for detecting environment noise according to a detected audio signal from at least a microphone of the computing device; and
   an intelligibility enhancement unit, coupled to the environment noise determination unit, for obtaining noise information according to the detected environment noise and a first audio signal, outputting a second audio signal by boosting the first audio signal under an adjustable headroom according to the noise information and the first audio signal, changing the adjustable headroom to a first value when a signal level of the first audio signal is under a threshold level and changing the adjustable headroom to a second value less than the first value when the signal level of the first audio signal is over the threshold level, wherein the adjustable headroom is a maximum allowable increase in a gain of the boosting of the first audio signal.

11. The apparatus according to claim 10, wherein the noise information indicates a measurement level of the detected environment noise with respect to the first audio signal.

12. The apparatus according to claim 10, wherein the environment noise determination unit comprises:
   a pro-processing module, for outputting an audio signal according to the detected audio signal, comprising: a voice activity detection module to determine whether the detected audio signal indicates noise or not and output result of the determination; and
   a noise estimation module, in response to the determination result and the audio signal from the pre-processing module, for outputting a reference noise signal.

13. The apparatus according to claim 10, wherein the intelligibility enhancement unit is operative to adjust the adjustable headroom according to the signal level of the first audio signal such that a signal level of the second audio signal is proportional to the signal level of the first audio signal and below a truncated threshold.

14. The apparatus according to claim 10, wherein the intelligibility enhancement unit comprises:
   a signal-to-noise ratio estimation module, in response to a reference noise signal and the first audio signal, for outputting the noise information;
   a boosting module; and
   a gain calculation module, coupled between the boosting module and the signal-to-noise ratio estimation module, in response to the noise information and the first audio signal, for controlling the boosting module to boost the first audio signal.

15. The apparatus according to claim 14, wherein the intelligibility enhancement unit further comprises:
   a pre-processing module, for determining whether the first audio signal is noise;
   wherein if the pre-processing module determines that the first audio signal is noise, the pre-processing module informs the gain calculation module to control the boosting module to output the second audio signal without boosting the first audio signal.

16. The apparatus according to claim 14, wherein the pre-processing module determines whether the first audio signal is noise according to voice activity detection or noise estimation of the first audio signal.

17. A computing apparatus, comprising:
   at least a microphone;
   a processing unit for controlling the computing apparatus;
   a communication unit;
   a signal processing unit, coupled to the processing unit and the communication unit, for audio intelligibility enhancement, comprising:
   an environment noise determination unit for detecting environment noise according to a detected audio signal from the at least a microphone; and
   an intelligibility enhancement unit, coupled to the environment noise determination unit, for obtaining noise information according to the detected environment noise and a first audio signal, outputting a second audio signal by boosting the first audio signal under an adjustable headroom according to the noise information and the first audio signal, changing the adjustable headroom to a first value when a signal level of the first audio signal is under a threshold level and changing the adjustable headroom to a second value less than the first value when the signal level of the first audio signal is over the threshold level, wherein the adjustable headroom is a maximum allowable increase in a gain of the boosting of the first audio signal.

18. The computing apparatus according to claim 17, wherein the intelligibility enhancement unit is operative to adjust the adjustable headroom according to the signal level of the first audio signal such that a signal level of the second audio signal is proportional to the signal level of the first audio signal and below a truncate threshold.

19. The computing apparatus according to claim 17, wherein the intelligibility enhancement unit comprises:
   a signal-to-noise ratio estimation module, in response to a reference noise signal and the first audio signal, for outputting the noise information;
   a boosting module; and
   a gain calculation module, coupled between the boosting module and the signal-to-noise ratio estimation module, in response to the noise information and the first audio signal, for controlling the boosting module to boost the first audio signal.

20. The computing apparatus according to claim 19, wherein the intelligibility enhancement unit further comprises:
   a pre-processing module, for determining whether the first audio signal is noise;
   wherein if the pre-processing module determines that the first audio signal is noise, the pre-processing module informs the gain calculation module to control the boosting module to output the second audio signal without boosting the first audio signal.

21. The computing apparatus according to claim 17, wherein the communication unit outputs the first audio signal to the signal processing unit and the first audio signal is a downlink audio signal for voice communication.

22. The computing apparatus according to claim 17, wherein the processing unit outputs the first audio signal to the signal processing unit according to a multimedia source.

23. The computing apparatus according to claim 17, wherein the second audio signal is outputting by boosting the first audio signal with respect to at least one frequency band for human hearing.

* * * * *